United States Patent [19]

Das et al.

[11] Patent Number: 4,652,896
[45] Date of Patent: Mar. 24, 1987

[54] MODULATION DOPED GAAS/ALGAAS FIELD EFFECT TRANSISTOR

[75] Inventors: Mukunda B. Das, State College, Pa.; George B. Norris, Dayton; Joseph A. Grzyb, Centerville, both of Ohio

[73] Assignee: The United States of America as represented by the Secretary of the Air Force, Washington, D.C.

[21] Appl. No.: 749,368

[22] Filed: Jun. 27, 1985

[51] Int. Cl.⁴ .......................................... H01L 29/80
[52] U.S. Cl. ...................................... 357/22; 357/16; 357/55
[58] Field of Search .................. 357/22 MD, 23.1, 16, 357/55, 22 A

[56] References Cited

U.S. PATENT DOCUMENTS

| 4,157,556 | 6/1979 | Decket et al. | 357/22 |
|---|---|---|---|
| 4,186,410 | 1/1980 | Cho et al. | 357/67 |
| 4,194,935 | 3/1980 | Dingle et al. | 357/22 X |
| 4,333,100 | 6/1982 | Morcom et al. | 357/71 |
| 4,424,525 | 1/1984 | Mimura | 357/22 MD X |
| 4,455,564 | 6/1984 | Delagebeaudeuf et al. | 357/22 |
| 4,492,974 | 1/1985 | Yoshida et al. | 357/23 |
| 4,494,016 | 1/1985 | Ransom et al. | 307/450 |
| 4,558,337 | 12/1985 | Saunier et al. | 357/22 A |
| 4,559,547 | 12/1985 | Shiraki et al. | 357/22 A |

FOREIGN PATENT DOCUMENTS

| 0051271 | 5/1982 | European Pat. Off. | 357/22 MD |
|---|---|---|---|
| 58-96770 | 6/1983 | Japan | 357/22 MD |
| 58-143572 | 8/1983 | Japan | 357/22 MD |

OTHER PUBLICATIONS

Ogura et al, "Self-Aligned Enhancement Mode FET with AlGaAs Gate Insulator", *J. Vac. Sci. Technol.* B 3(2) Mar./Apr. 1985, pp. 581–583.

Judaprawira, "Modulation-Doped MBE GaAs/N-Al$_x$-Ga1-x As MESFETs", *IEEE Electron Device Letters*, vol. EDL-2, No. 1, Jan. 1981, pp. 14–15.

Kopp et al, "Characteristics of Submicron Gate GaAs FET's with Al$_{0.3}$Ga$_{0.7}$As Buffers: Effects of Interface Quality", *IEEE Electron Device Letters*, vol. EDL-3, No. 2, Feb. 1982, pp. 46–48.

Hiyamizu, et al, "MBE-Grown GaAs/N-AlGaAs Heterostructures and their Application to High Electron Mobility Transistors", *Jap. Jour. of Appl. Physics*, vol. 21, 1982, Supp. 21-1, pp. 161–168.

Umebachi et al, "A New Heterojunction Gate GaAs FET", *IEEE Transactions on Electron Devices*, Aug. 1975, pp. 613–614.

Paul M. Solomon and Hadis Morkoc, "Modulation Doped GaAs/AlGaAs Heterojunction Field-Effect Transistors (MODFET's), Ultrahigh-Speed Device for Supercomputers" IEEE Transactions on Electron Devices, vol. ED-31, No. 8, Aug. 84, 1015–1027.

Makunda B. Das, "A High Aspect Ratio Design Approach to Millimeter-Wave HEMT Structures", IEEE Transactions on Electron Devices, vol. ED-32, No. 1, Jan. 85, 11–17.

*Primary Examiner*—J. Carroll
*Assistant Examiner*—William A. Mintel
*Attorney, Agent, or Firm*—Bernard E. Franz; Donald J. Singer

[57] ABSTRACT

To realize a depletion-mode modulation-doped field-effect transistor with high gate-length to depletion-depth ratio that is capable of providing high power gain at millimeter-wave frequencies, an ohmic gate or a heterojunction gate is used on the n-AlGaAs/GaAs layered structure, replacing the prior art Shottky-barrier metal gate. The depletion-mode operation is desirable for analog signal amplifying circuits as opposed to the enhancement-mode device commonly used for switching or digital circuits. In the case of Schottky-barrier gate, high aspect ratio structures naturally operate in the enhancement mode, hence the need for the change in the gate electrode structure.

7 Claims, 10 Drawing Figures

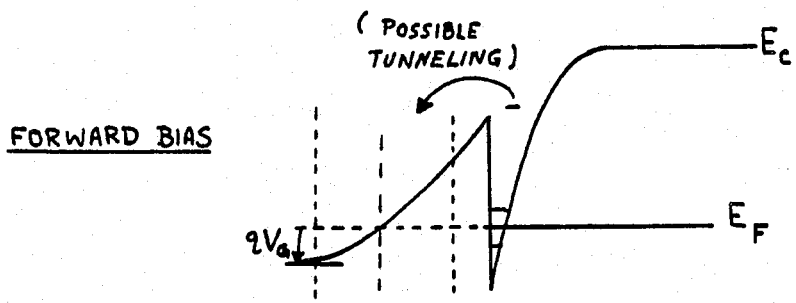
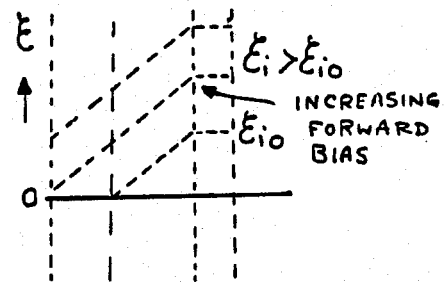
Fig. 5c
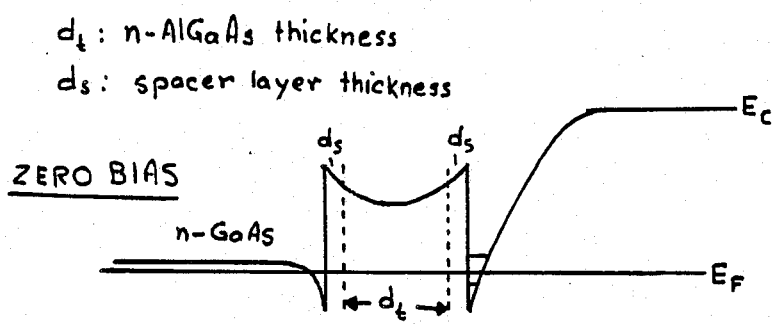
Fig. 6a
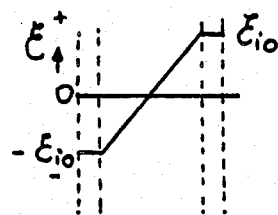

MODULATION DOPED GAAS/ALGAAS FIELD EFFECT TRANSISTOR

RIGHTS OF THE GOVERNMENT

The invention described herein may be manufactured and used by or for the Government of the United States for all governmental purposes without the payment of any royalty.

BACKGROUND OF THE INVENTION

The present invention relates generally to the field of MODFETs (modulation doped heterojunction field effect transistors) on n-AlGaAs/GaAs structures for analog operation, particularly at millimeter wavelengths.

Since the discovery by Dingle et al ("Electronic Mobilities in Modulation-doped Semiconductor Heterojunction Superlattices", Appl. Phys. Lett. Vol. 33, p.665, (1978)) of high mobility two-dimensional electron gas in N-AlGaAs/GaAs heterojunction structures, considerable progress has been made in utilizing these structures for practical realization of FETs based on Schottky-barrier type gates. See for example S. Hiyamizu et al. "MBE-Grown GaAs/n-GaAs Heterostructures and Their Application to High Electron Mobility Transistors", Japan J.Appl. Phys. Vol 21, p.161, (1981); D. Delagebeaudeuf et al, Metal-(n)AlGaAs-GaAs Two Dimensional Electron Gas FET", IEEE Trans Electron Dev. ED-29, p.955, (1982); T. J. Drummond et al, "Influence of $Al_xGa_{1-x}$ As Buffer Layers on the Performance of Modulation Doped Field Effect Transistors", Appl. Phys. Lett. Vol. 40, p.879, (1982); and P. C. Chao et al "Quarter-micron Gate Length Microwave High Electron Mobility Transistors", Presented at the 1983 IEEE/Cornell Conference on High Speed Semiconductor Devices and Circuits", Ithaca NY, Aug. 15–17, 1983. For a review paper on MODFETs, see P. M. Solomon and H. Morcoc, IEEE Trans. on Electron Devices, ED-31, p.1015 (1984). Also of interest is a paper by M. Ogura et al. "Self-aligned Enhancement Mode FET with AlGaAs as Gate Insulator", J. Vac. Sci. Technol. B 3 (2), Mar/Apr 1985, page 581.

U.S. patents of interest relating to field effect transistors include U.S. Pat. No. 4,494,016 to Ransom et al disclosing a GaAs depletion mode MESFET useful as a linear power amplifier. It includes a semi-insulating host GaAs substrate which has a uniform depth N+ source, gate and drain implant. The N+ implant region has a very high dopant concentration. Delagebeudeuf et al in U.S. Pat. No. 4,455,564 are concerned with a high frequency field effect transistor which uses a heterojunction between the GaAs and AlGaAs layers to create a high mobility electron accumulation layer and a Schottky grid to control the load. Decker et al in U.S. Pat. No. 4,157,556 disclose a heterojunction in a confinement field effect transistor. In that patent a GaAs conducting channel is bounded by an AlGaAs layer. Cho et al in U.S. Pat. No. 4,186,410 discuss the formation of ohmic contacts in GaAs FETs. Ohmic contacts using silicon doped aluminum are taught in Morcon et al U.S. Pat. No. 4,333,100. Yoshida et al in U.S. Pat. No. 4,492,974 disclose a DMOS which comprises a MOSFET with a gate protection diode.

SUMMARY OF THE INVENTION

An object of the invention is realization of a depletion-mode modulation-doped field-effect transistor with high gate-length to depletion-depth ratio that is capable of providing high power gain at millimeter-wave frequencies.

According to the invention, an ohmic gate or a heterojunction gate is used on the n-AlGaAs/GaAs layered structure.

The depletion-mode operation is desirable for analog signal amplifying circuits as opposed to the enhancement-mode device commonly used for switching or digital circuits. In the case of Schottky-barrier gate, high aspect ratio structures naturally operate in the enhancement mode.

The device achieved with the invention is suitable for millimeter-wave air-to-air communications systems involving frequencies up to 94 GHz.

BRIEF DESCRIPTION OF THE DRAWING

FIGS. 5a–5c show ohmic-gate MODFET schematic band and field diagrams under (5a) zero, (5b) reverse, and (5c) forward bias conditions; and FIGS. 6a–6c show heterojunction gate MODFET band and field diagrams under (6a) zero, (6b) reverse, and (6c) forward bias conditions.

DETAILED DESCRIPTION

Figure 1:
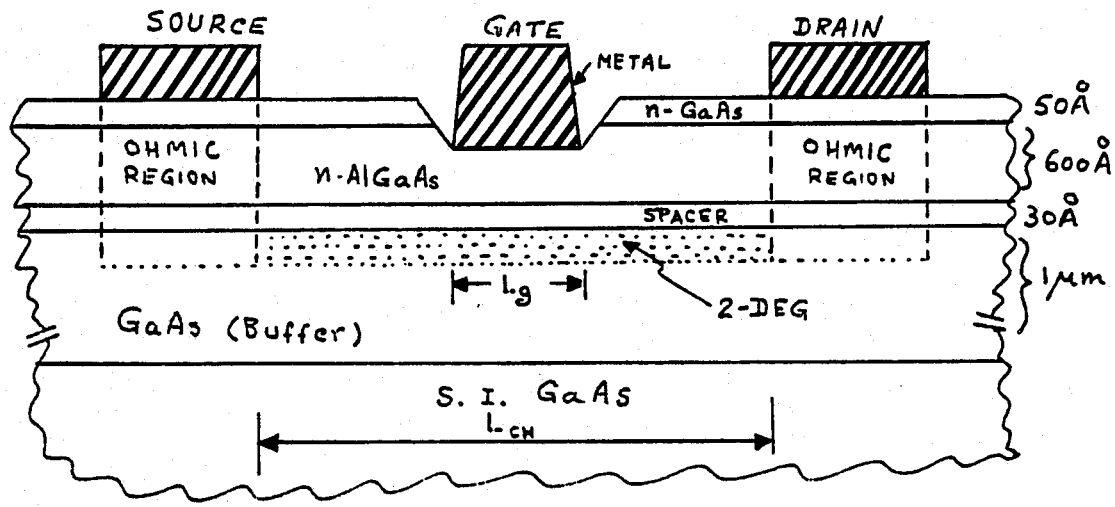
FIG. 1 is a cross-sectional schematic diagram of a conventional Schottky-Barrier gate MODFET structure.
Figure 2:
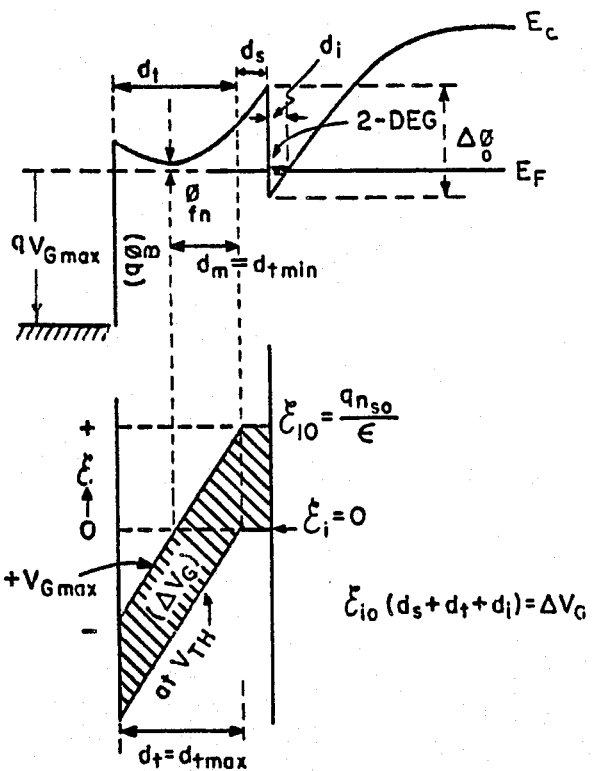
FIG. 2 shows schematic band and field diagrams for the conventional Schottky-barrier gate MODFET structure of FIG. 1.
Figure 3:
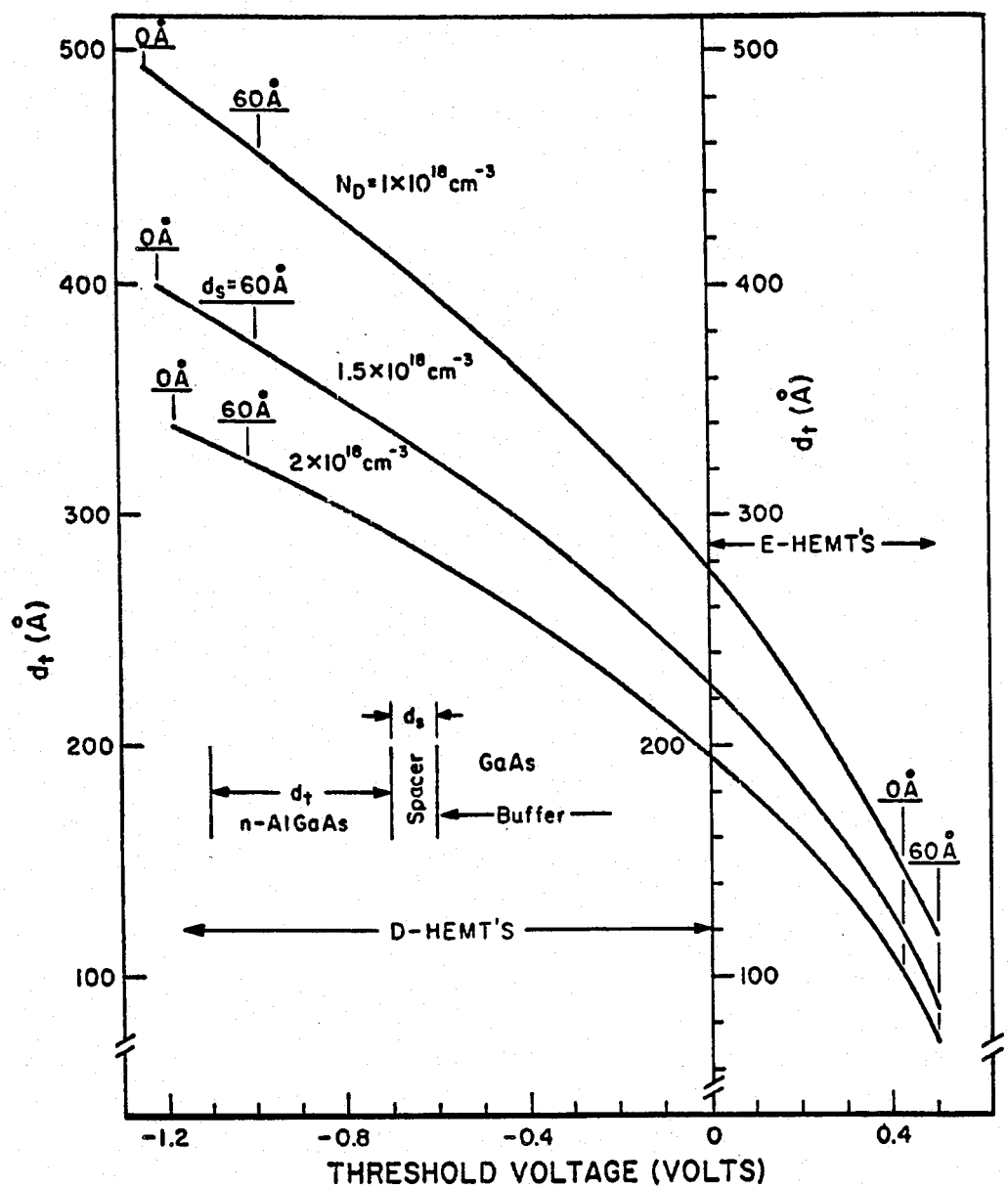
FIG. 3 is a graph of the n-AlGaAs Layer thickness vs. threshold voltgage in Shottky-barrier gate MODFETs.

A cross sectional schematic diagram of a typical conventional Schottky barrier gate MODFET structure is shown in FIG. 1, with its band and field diagrams given in FIG. 2. The Schottky barrier height $\phi_B$ is responsible for the partial depletion of the n-AlGaAs layer of thickness $d_t$. The two-dimensional electron gas (2-DEG) is supplied by the fractional thickness $d_m$, and $d_s$ is the spacer layer thickness intended to maintain donor-carrier separation for high electron mobility. The electric field diagram illustrates the situation of complete depletion of the n-AlGaAs layer with zero applied gate voltage. The maximum n-AlGaAs layer thickness should not exceed $d_{tmax}$ corresponding to the situation that yields the maximum sheet carrier concentration ($n_{so}$) in the 2-DEG at zero applied voltage. As $d_t$ is reduced below $d_{tmax}$, the threshold voltage ($V_{TH}$), at which the device channel conductance vanishes, becomes less and less negative and even positive as graphically illustrated in FIG. 3. The maximum positive threshold voltage for a given doping concentration, $N_D$, in the n-AlGaAs layer corresponds to its minimum value $d_m$ and slightly increases with the space layer thickness.

In submicron gate-length millimeter-wave MODFETs if a high power gain is desired the aspect ratio determined by the gate-length-to-gate depletion depth must be very high (see M. D. Das "A High Aspect Ratio design Approach for Millimeter-Wave HEMT Structures" IEEE Trans. on Electron Devices, Vol. ED-32, No. 1, p. 11, January, 1985.) Thus it is apparent that use of the conventional Schottky-barrier gate in high aspect ratio MODFETs would result in enhancement-mode devices, whereas for analog applications it is preferable that these devices operate in the depletion-mode.

Figure 4:
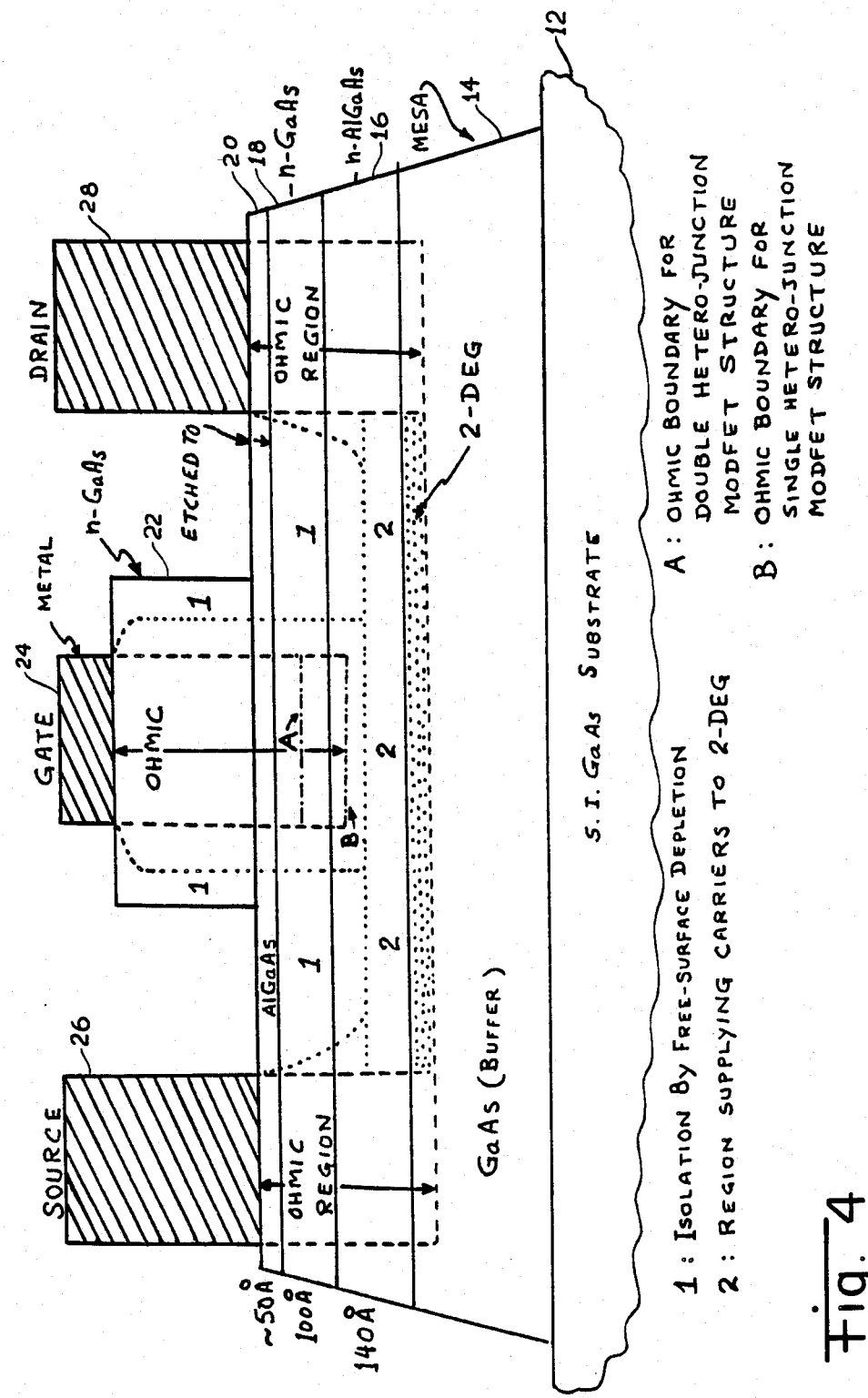
FIG. 4 is a cross-sectional schematic diagram of the ohmic-(and heterojunction) gate MODFET structure according to the invention.

The design to achieve the depletion-mode operation for the MODFET's is illustrated in FIG. 4. A semi-insulating GaAs substrate 12 is used, on which there is GaAs buffer layer 14, an n-AlGaAs layer 16, a n-GaAs layer 18, a thin n-AlGaAs layer 20, and another n-GaAs layer 22. An additionl undoped AlGaAs or AlAs spacer layer (not shown) may be placed between layers 14 and 16 to reduce the electronic scattering by donors in layer 16. The use of AlAs will increase the heterostructure barrier potential. This could be desirable to reduce leakage current in the ohmic-gate and heterostructure gate FETs.

A mesa is first etched in the layers from 22 through 14 down to the substrate 12. The layer 22 is further etched to leave an area for the gate. A metal contact 24 is formed at the top of the gate. Metal contacts 26 and 28 are also formed for the source and drain.

The structure in FIG. 4 realizes electrical isolation between the gate 24 and drain 28, and the gate and source 26 terminals, through the use of free-surface potential depletion and the gate itself is formed by the ohmic contact process. The thick n-GaAs topmost layer 22 is retained in the gate region and removed from its source and the drain regions by etching using the ultra thin AlGaAs layer 20 (<50 Å) as the etch-stop layer. Because of the additional thick n-GaAs top-layer 22 under the gate metal 24 the ohmic contact penetration after alloying can be expected to be much less under the gate compared to that under the drain and the source metallization. By a proper selection of alloying time and/or composition of Au/Ge/Ni or other metals the ohmic contact penetration under the gate can be controlled either to the depth where n-AlGaAs begins (shown as line B in FIG. 4) or where n-GaAs layer, below the ultra thin AlGaAs layer, begins (as shown by line A under the gate). The doping and the thickness of the n-GaAs layer 18 and that of the n-AlGaAs layer 16 should be selected to realize the formation of the depletion regions as indicated by the dotted lines. The region 1 on both sides of the gate are due to the free-surface potential and the region 2 is due to the transfer of electrons to the 2-DEG. Typical values of doping and thickness of the n-AlGaAs layer 16 are $2 \times 10^{18}$ cm$^{-3}$ and 140 Å, respectively, whereas those for the n-GaAs layer 18 immediately above the n-AlGaAs are $4 \times 10^{17}$ cm$^{-3}$ and 300 Å, respectively.

Figure 5A:
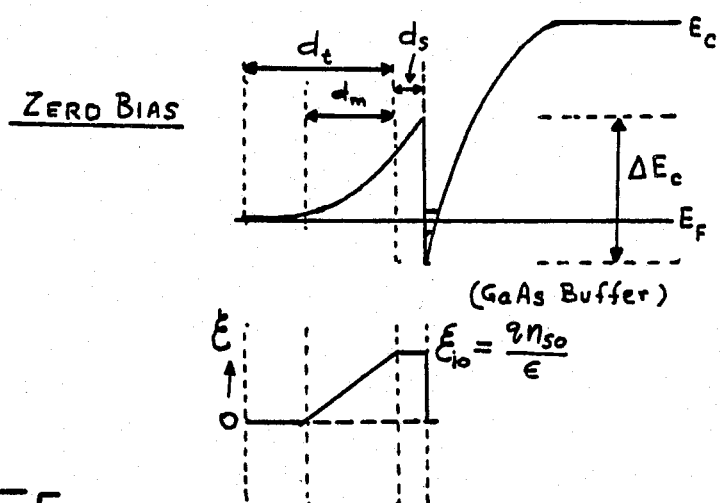
Figure 5B:
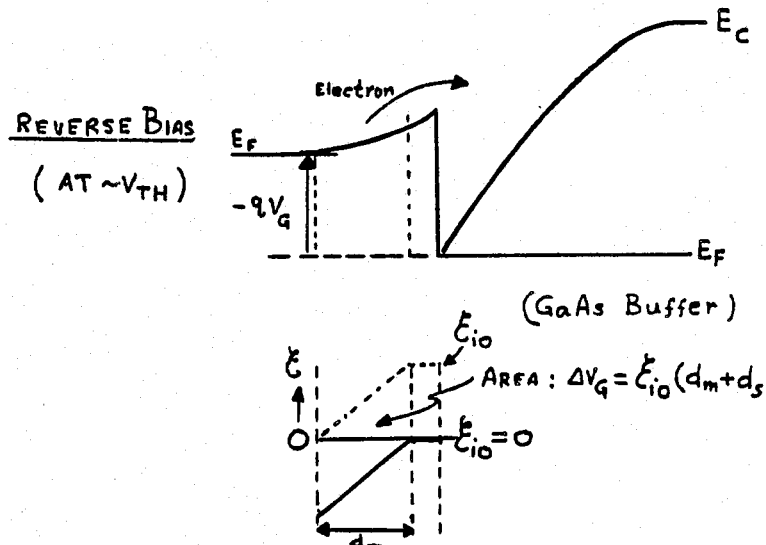

The total depletion depth under the gate, when the ohmic contact penetration is up to the depth indicated by the line B, would be equal to the depth of region 2 including any spacer layer thickness (~30 Å) (if present) plus the effective thickness of the 2-DEG (~80Å). Altogether this can be as low as 200 Å, providing an aspect ratio of 12.5 for a 0.25 μm length gate. This device will operate well at zero gate bias voltage with nearly full channel conduction and limited extent of reverse or forward bias can be applied either to deplete or enhance the channel conduction with excessive gate leakage current flow due to tunneling or carrier injection processes as illustrated schematically in FIGS. 5a, 5b, and 5c. At liquid nitrogen temperature, the leakage current components will be negligible and the device will operate under both forward and reverse gate bias conditions. An important advantage is realized in this structure due to the elimination of the Schottky gate contact, i.e. the transconductance should be high (by a factor of 1.75–2.55) due to the absence of the voltage drop across the Schottky depletion region with comparable increases in the power gain and stability margin.

Figure 6B:
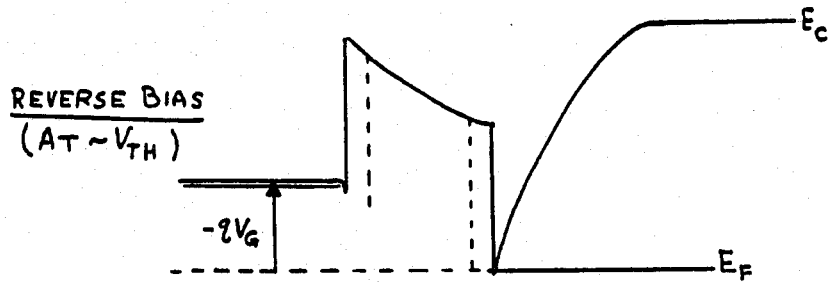
Figure 6B:
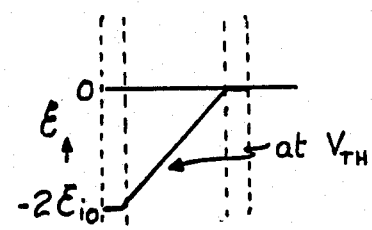
Figure 6C:
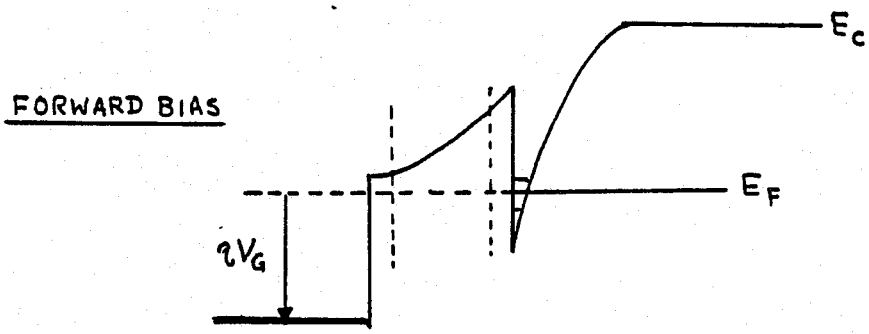
Figure 6C:
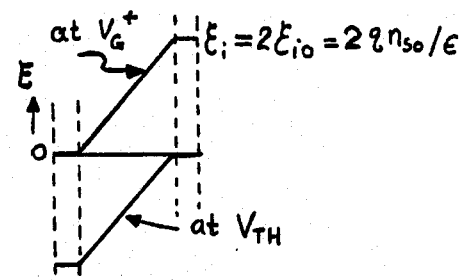
Figure 6C:
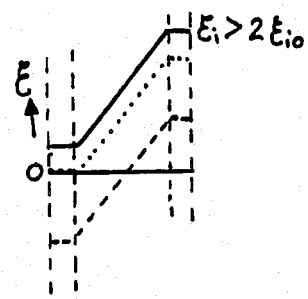

The device behavior becomes quite different when the ohmic contact penetration under the gate electrode is up to the line A (see FIG. 4). In this case there is a second hetero-junction between the n-GaAs and n-AlGaAs with the transfer of 2-DEG into the n-GaAs as shown schematically in FIG. 6a, including two spacer layers. It is not necessary to have the spacer layer between the n-AlGaAs and the n-GaAs layer, however. The device has two back-to-back hetero-junctions as considered above. The total minimum depletion depth that can be realized in this structure, with the full 2-DEG for the channel region, would be greater than 250 Å. However, a device with depletion depth of 200 Å or less can be forward biased to enhance the electron concentration in the 2-DEG. In addition, there will be increased transconductance over the conventional Schottky gate devices, although not to the degree found in the single hetero-junction device described previously. However, this configuration would have the advantage of reduced gate leakage currents as a result of the additional heterojunction barrier. The operational details in terms of the band and the field diagrams are depicted in FIGS. 6b and 6c for the double heterojunction structure for the reverse and forward biased conditions of operations, respectively.

The ohmic gate single and double hetero-junction MODFET structures proposed above would provide depletion-mode operation and they can be built with high gate-length to gate depletion depth aspect ratio as required for the realization of stable high power gain. These devices will operate primarily under zero gate bias conditions at 296 K with limited positive and negative gate bias voltages. At liquid nitrogen temperature, operation at the full range of bias voltage changes should be possible. It has been shown that a 0.25 μm length gate MODFET with 210 Å depletion depth and Schottky barrier gate would provide a power gain greater than 6 dB at 92 GHz (see M. B. Das "A High Aspect Ratio Design Approach for Millimeter-Wave HEMT Structures" *IEEE Trans. on Electron Devices,* Vol. Ed-32, No. 1, p. 11, January 1985). The ohmic-gate device structures according to the present invention should be better than this predicted performance under depletion-mode operation and hence would be attractive for millimeter-wave integrated circuit analog amplifying system applications, as there will be no need to have an additional power supply for the gate electrode.

It is understood that certain modifications to the invention as described may be made, as might occur to one with skill in the field of this invention, within the scope of the appended claims. Therefore, all embodiments contemplated hereunder which achieve the objects of the present invention have not been shown in complete detail. Other embodiments may be developed without departing from the spirit of the invention or from the scope of the appended claims.

We claim:

1. A depletion-mode modulation-doped field-effect transistor with high gate-length to depletion-depth ratio that is capable of providing high power gain greater than 6 dB at millimeter-wave frequencies, supported by a semi-insulating GaAs substrate, comprising:

a buffer layer of GaAs on said substrate;
an n-AlGaAs layer above the buffer layer;
an n-GaAs layer on the n-AlGaAs layer;

a thin layer less than 50 Angstroms of AlGaAs on the n-GaAs layer.
an upper layer of n-GaAs in a gate region on the thin layer of AlGaAs, the gate length being less than one micron;
source and drain regions spaced from the gate region on the opposite sides, the source and drain regions having ohmic penetration from the surface of said thin layer down into the buffer layer;
said gate region having ohmic penetration from the surface of said upper layer down to a depth into said n-AlGaAs layer (16) to provide an ohmic boundary for a single hetero-junction MODFET structure, with a depletion region under the gate;
metallization formed on the gate, source, and drain regions to provide electrodes;
the n-GaAs layer and the n-AlGaAs layer having doping and thickness selected to realize the formation of the depletion regions between the ohmic regions for the source and the gate and also between the ohmic regions for the drain and gate down to an intermediate depth in the n-AlGaAs layer.

2. Apparatus as set forth in claim 1, wherein under said gate region the total effective depletion depth is less than about 300 angstroms.

3. Apparatus as set forth in claim 1, further including a thin spacer layer of undoped AlGaAs between said buffer layer of GaAs and said n-AlGaAs layer.

4. Apparatus as set forth in claim 1, further including a thin spacer layer of undoped AlAs between said buffer layer of GaAs and said a-AlGaAs layer.

5. A depletion-mode modulation-doped field-effect transistor with high gate-length to depletion-depth ratio that is capable of providing high power gain (greater than 6 dB) at millimeter-wave frequencies, supported by a semi-insulating GaAs substrate, comprising:
a buffer layer of GaAs on said substrate;
an n-AlGaAs layer above the buffer layer;
an n-GaAs layer on the n-AlGaAs layer;
a thin layer less than 50 Angstroms of AlGaAs on the n-GaAs layer;
an upper layer of n-GaAs in a gate region on the thin layer of AlGaAs, the gate length being less than one micron;
source and drain regions spaced from the gate region on opposite sides, the source and drain regions having ohmic penetration from the surface of said thin layer down into the buffer layer;
said gate region having ohmic penetration from the surface of said upper layer down to a depth into said n-GaAs layer (18) to provide an ohmic boundary for a double hetero-junction MODFET structure, with a depletion region under the gate;
metallization formed on the gate, source, and drain regions to provide electrodes;
the n-GaAs layer and the n-AlGaAs layer having doping and thickness selected to realize the formation of the depletion regions between the ohmic regions for the source and the gate and also between the ohmic regions for the drain and gate down to an intermediate depth in the n-AlGaAs layer.

6. Apparatus as set forth in claim 5, further including a thin spacer layer of undoped AlGaAs between said buffer layer of GaAs and said n-AlGaAs layer.

7. Apparatus as set forth in claim 5, further including a thin spacer layer of undoped AlAs between said buffer layer of GaAs and said n-AlGaAs layer.

* * * * *